(12) United States Patent
Rudolph et al.

(10) Patent No.: US 12,119,236 B2
(45) Date of Patent: Oct. 15, 2024

(54) METHOD FOR PRODUCING A CONNECTION STRUCTURE AND SEMICONDUCTOR DEVICE

(71) Applicant: OSRAM Opto Semiconductors GmbH, Regensburg (DE)

(72) Inventors: Andreas Rudolph, Regensburg (DE); Teresa Baur, Regensburg (DE); Christoph Klemp, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 306 days.

(21) Appl. No.: 17/442,624

(22) PCT Filed: Mar. 20, 2020

(86) PCT No.: PCT/EP2020/057784
§ 371 (c)(1),
(2) Date: Sep. 24, 2021

(87) PCT Pub. No.: WO2020/193408
PCT Pub. Date: Oct. 1, 2020

(65) Prior Publication Data
US 2022/0172960 A1    Jun. 2, 2022

(30) Foreign Application Priority Data
Mar. 26, 2019    (DE) .......................... 102019107760.5

(51) Int. Cl.
*H01L 21/48*    (2006.01)
*H01L 21/768*    (2006.01)
*H01L 23/538*    (2006.01)

(52) U.S. Cl.
CPC ...... *H01L 21/486* (2013.01); *H01L 21/76871* (2013.01); *H01L 23/5384* (2013.01); *H01L 23/5386* (2013.01)

(58) Field of Classification Search
CPC ............. H01L 21/486; H01L 21/76871; H01L 23/5384; H01L 23/5386; H01L 21/2885;
(Continued)

(56) References Cited

U.S. PATENT DOCUMENTS

2006/0046432 A1* 3/2006 Sankarapillai ...... H01L 25/0657
257/E21.597
2007/0180916 A1    8/2007 Tian et al.
(Continued)

FOREIGN PATENT DOCUMENTS

CN    103700595 B  *  7/2016  ......... H01L 21/6835
DE    102007007178 A1    8/2007
(Continued)

OTHER PUBLICATIONS

Search Report for the corresponding German Patent application No. 10 2019 107 760.5, issued Oct. 21, 2019, 7 p.p. (for informational purposes, only).
(Continued)

*Primary Examiner* — Evan G Clinton
(74) *Attorney, Agent, or Firm* — VIERING, JENTSCHURA & PARTNER mbB

(57) ABSTRACT

A method of manufacturing a connection structure may include forming an opening in a first main surface of a first substrate, forming a galvanic seed layer over a first main surface of a carrier substrate, and connecting the first main surface of the first substrate to the first main surface of the carrier substrate, such that the galvanic seed layer is arranged between the first main surface of the first substrate and the first main surface of the carrier substrate. The
(Continued)

method may further include galvanically forming a conductive material over the galvanic seed layer.

10 Claims, 6 Drawing Sheets

(58) Field of Classification Search
CPC ........... H01L 21/76898; H01L 21/4846; H01L 21/6835
See application file for complete search history.

(56) References Cited

U.S. PATENT DOCUMENTS

| | | | |
|---|---|---|---|
| 2008/0164573 A1* | 7/2008 | Basker | ................. H01L 21/486 257/E23.09 |
| 2008/0315230 A1 | 12/2008 | Murayama | |
| 2009/0255716 A1 | 10/2009 | Kariya et al. | |
| 2011/0111560 A1* | 5/2011 | Purushothaman | ...... H01L 25/50 438/109 |
| 2016/0276174 A1* | 9/2016 | Kim | .................... H01L 23/5389 |
| 2018/0151475 A1 | 5/2018 | Oshige | |

FOREIGN PATENT DOCUMENTS

| | | | |
|---|---|---|---|
| EP | 1749794 A2 | 2/2007 | |
| WO | WO-2012119333 A1 * | 9/2012 | ....... H01L 21/76224 |

OTHER PUBLICATIONS

International Search Report for the corresponding PCT application No. PCT/EP2020/057784, mailed Jun. 9, 2020, 4p.p (for informational purposes only).

* cited by examiner

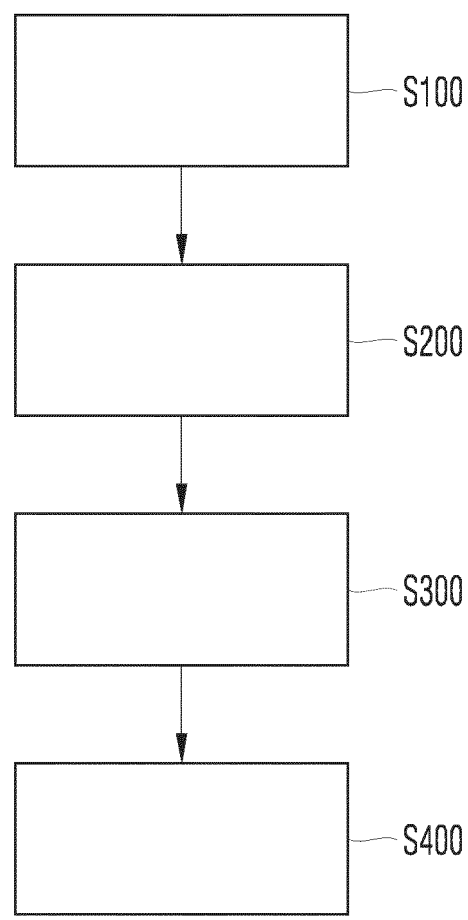

METHOD FOR PRODUCING A CONNECTION STRUCTURE AND SEMICONDUCTOR DEVICE

CROSS-REFERENCE TO RELATED APPLICATIONS

The present application is a national stage entry according to 35 U.S.C. § 371 of PCT Application No. PCT/EP2020/057784 filed on Mar. 20, 2020; which claims priority to German Patent Application Serial No. 10 2019 107 760.5 filed on Mar. 26, 2019; all of which are incorporated herein by reference in their entirety and for all purposes.

TECHNICAL FIELD

The present disclosure relates to a connection structure and a semiconductor device.

BACKGROUND

Semiconductor devices are widely used in a wide variety of fields of application. Semiconductor devices are, for example, manufactured by processing semiconductor wafers, which are separated into individual semiconductor chips after processing steps have been carried out at the wafer level. For electrical contacting, individual semiconductor chips or processed semiconductor wafers may be joined together with and electrically connected to a substrate in which a plurality of connection structures are formed.

SUMMARY

The present disclosure is based on the object of providing an improved method of manufacturing a connection structure and an improved semiconductor device.

According to embodiments, a method of manufacturing a connection structure comprises forming an opening in a first main surface of a first substrate, forming a galvanic seed layer over a first main surface of a carrier substrate, and connecting the first main surface of the first substrate to the first main surface of the carrier substrate, so that the galvanic seed layer is arranged between the first main surface of the first substrate and the first main surface of the carrier substrate. The method further includes galvanically forming a conductive material over the galvanic seed layer.

According to embodiments, the method further includes thinning the first substrate so that the opening in the first substrate is opened on a second main surface of the first substrate facing away from the carrier substrate.

Furthermore, the method may include forming an insulation layer over sidewalls of the opening in the first substrate.

For example, in the aforementioned method, connecting the first main surface of the first substrate to the first main surface of the carrier substrate may include applying a connection layer between the galvanic seed layer and the first main surface of the first substrate. Furthermore, the method may include removing the connection layer from the surface of the openings facing the carrier substrate after the first substrate and the carrier substrate have been joined together, so that the galvanic seed layer becomes exposed. According to embodiments, the conductive material may completely fill the opening in the first substrate.

For example, the opening in the first substrate may have a width greater than 20 μm. A depth of the opening in the first substrate may, for example, be greater than 50 μm.

The method may further include forming a separating layer over the carrier substrate, with the separating layer being arranged between the galvanic seed layer and the first main surface of the carrier substrate.

According to embodiments, the method may further include connecting the second main surface of the first substrate to a second semiconductor substrate within which a functional portion is arranged, so that the functional portion is electrically connected to the conductive material.

According to embodiments, the method may further comprise removing the carrier substrate after the main surface of the first substrate facing away from the carrier substrate has been connected to the functional portion.

According to embodiments, a semiconductor device is manufactured according to the method described above.

According to embodiments, a semiconductor device comprises a first semiconductor substrate having a first main surface, with the first main surface containing an opening, an insulation layer being arranged over sidewalls of the opening and the opening being filled with a conductive material. Furthermore, the semiconductor device includes a second semiconductor substrate within which a functional portion is arranged, which is electrically connected to the conductive material.

For example, the functional portion in the semiconductor device described above may be an optoelectronic semiconductor device.

According to embodiments, the conductive material in the semiconductor device described above may be nickel or aluminum.

According to embodiments, the opening may, in the semiconductor device described above, have a depth greater than 50 μm.

BRIEF DESCRIPTION OF THE DRAWINGS

The accompanying drawings serve to provide an understanding of non-limiting embodiments. The drawings illustrate non-limiting embodiments and, together with the description, serve to explain them. Further non-limiting embodiments and numerous of the intended advantages emerge directly from the following detailed description. The elements and structures shown in the drawings are not necessarily shown true to scale. Identical reference numerals refer to identical or corresponding elements and structures.

FIG. 6 summarizes a method according to embodiments.

DETAILED DESCRIPTION

In the following detailed description, reference is made to the accompanying drawings, which form part of the disclosure, and in which specific exemplary embodiments are shown for purposes of illustration. In this context, directional terminology such as "top", "bottom", "front", "back", "over", "on", "in front of", "behind", "leading", "trailing", etc. refers to the orientation of the figures just described. Since the components of the exemplary embodiments may be positioned in different orientations, the directional terminology is only used for explanation and is not restrictive in any way.

The description of the exemplary embodiments is not restrictive, since also other exemplary embodiments exist and structural or logical changes may be made without deviating from the scope defined by the claims. In particular, elements of exemplary embodiments described in the following text may be combined with elements of other exemplary embodiments described, unless the context indicates otherwise.

The term "substrate" used within the scope of the present description generally includes insulating, conductive or semiconductor substrates.

To the extent that the terms "have", "contain", "comprise", "include" and the like are used herein, they are open-ended terms that indicate the presence of said elements or features, but do not rule out the presence of other elements or features. The indefinite articles and the definite articles include both the plural and the singular, unless the context clearly indicates otherwise.

The term "vertical", as used in this description, is intended to describe an orientation which is essentially perpendicular to the first surface of a substrate or semiconductor body. The vertical direction may, for example, correspond to a direction of growth when layers are grown on.

The terms "lateral" and "horizontal", as used in this description, are intended to describe an orientation or alignment which runs essentially parallel to a first surface of a substrate or semiconductor body. This may, for example, be the surface of a wafer or a chip (die).

The horizontal direction may, for example, lie in a plane perpendicular to a direction of growth when layers are grown on.

In the context of this description, the term "electrically connected" means a low-ohmic electrical connection between the connected elements. The electrically connected elements need not necessarily be directly connected to one another.

Additional elements may be arranged between electrically connected elements.

The term "electrically connected" also includes tunnel contact between the connected elements.

Figure 1:
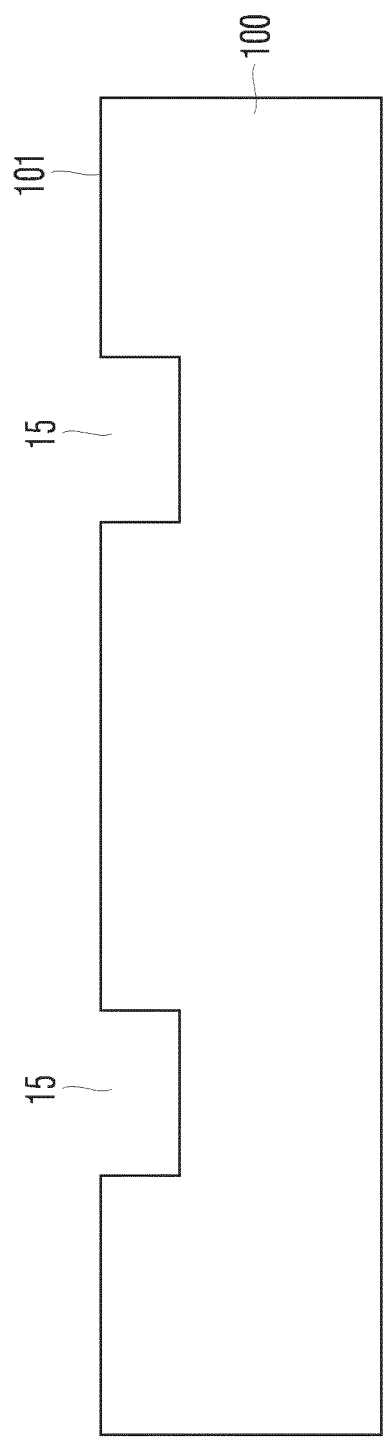
FIGS. 1 to 4 each show vertical cross-sectional views of a workpiece whilst carrying out the method of manufacturing a connection structure according to embodiments.

FIG. 1 shows a vertical cross-sectional view of a workpiece whilst carrying out the method of manufacturing a connection structure according to embodiments.

A vertical cross-sectional view through a first substrate 100 can be seen.

The first substrate 100 may, for example, be a semiconductor substrate, e.g. a silicon substrate.

The first substrate 100 contains a plurality of openings 15. The openings 15 are formed in the first main surface 101 of the first substrate 100. For example, the openings 15 may extend in the vertical direction through the first substrate.

For example, the openings 15 may be formed by means of ion etching using a photolithographic mask.

The openings 15 may, for example, have a width greater than 20 µm. Furthermore, the openings 15 may, for example, have a width of less than 50 µm. In this process, "width" denotes a maximum dimension in a lateral direction.

The depth of the openings 15 may be greater than 50 µm. Furthermore, the depth of the openings 15 may be more than 100 µm. For example, the depth of the openings may be up to approximately 200 µm, for example, approximately 150 µm. In this process, "depth" denotes a maximum dimension in a vertical direction.

The openings 15 may, for example, be cylindrical. The cylinder axis may run in a vertical direction. The lateral cross-sectional area of the cylinder may, for example, have a circular, elliptical, rectangular or any other form.

According to embodiments, the openings 15 may be designed as so-called blind holes, so that, starting from the first main surface 101 of the first substrate 100, they extend in the vertical direction through the first substrate 100 and, in this process, do not completely penetrate the first substrate 100.

Subsequently, the first substrate 100 is connected to a carrier substrate 110.

For example, a first connection layer 130a is applied on the first main surface 101 of the first substrate 100. The first connection layer 130a may, for example, be a silicon oxide layer. As used herein, the term "connection layer" refers to a physical connection of elements. The first connection layer 130a may, in particular, be insulating.

According to embodiments, the first connection layer 130a may also be applied on the sidewalls 20 of the openings 15, so that the first connection layer 130a there becomes part of an insulation layer 155 covering the sidewalls 20. For example, the insulation layer 155 may be vapor-deposited, for example, by a CVD (chemical vapor deposition) process. According to further embodiments, the insulation layer may also be sputtered on. In this way—for example, in comparison to a thermal oxidation process—an insulation layer having the necessary thickness and quality may be produced in order to provide effective electrical insulation. According to further embodiments, the first connection layer 130a and the insulation layer 155 may also be produced by separate processes. For example, the insulation layer 155 may be applied by a CVD or sputtering process, as stated above, as a result of which good insulation of the sidewalls 20 of the openings is ensured. In addition, the connection layer 130a may be produced as spin-on-glass, that is to say, for example, by spin-coating.

Furthermore, a galvanic seed layer 120 is formed over a first main surface 111 of the carrier substrate 110. The carrier substrate 110 may, for example, be a semiconductor substrate, e.g. a silicon or a sapphire substrate. The galvanic seed layer 120 may, for example, be a gold layer.

A separating layer 140 may further be formed over the first main surface 111 of the carrier substrate 110. The separating layer 140 may, for example, contain silicon nitride.

For example, the separating layer 140 may be arranged between the galvanic seed layer 120 and the first main surface 111 of the carrier substrate 110.

The method may further include forming a second connection layer 130b over the galvanic seed layer 120.

The first main surface 101 of the first substrate 100 and the first main surface 111 of the carrier substrate 110 are connected to one another in such a manner that the galvanic seed layer 120 is arranged between the first main surface 101 of the first substrate 100 and the first main surface 111 of the carrier substrate 110.

Figure 2:
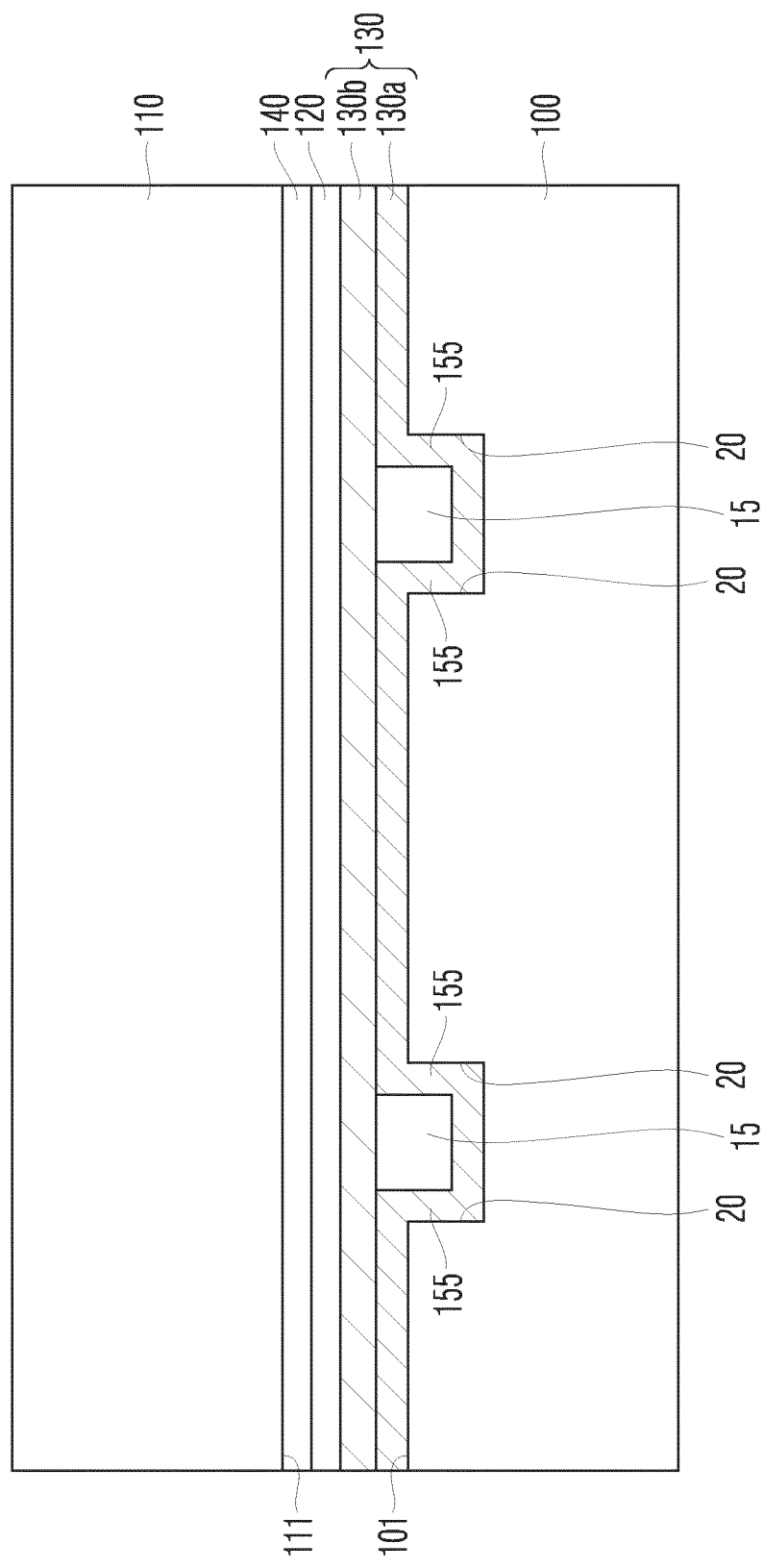

As a result, the workpiece shown in FIG. 2 may be obtained.

In this process, the first connection layer 130a and the second connection layer 130b may come into contact with one another and form a connected connection layer 130.

Subsequently, the first substrate 100 may be thinned on a side facing away from the carrier substrate 110.

The thinning of the first substrate 100 may, for example, include a grinding back process and, if necessary, also a chemical mechanical polishing process (CMP).

For example, after the thinning of the first substrate 100, the openings 15 may be exposed on a second main surface 102 of the first substrate 100 facing away from the carrier substrate 110. If necessary, the connection layer 130 may then be removed from the surface of the openings 15 facing the carrier substrate 110 and from the sidewalls 20 of the openings 15.

According to embodiments, a passivation layer 150 may subsequently be applied on the second main surface 102 of the first substrate 100. For example, the passivation layer 150 may contain silicon oxide or silicon nitride.

According to embodiments, the passivation layer 150 may also be applied on the sidewalls 20 of the openings 15, so that the passivation layer 150 there becomes part of an insulation layer 155 covering the sidewalls 20.

Furthermore, the connection layer 130 and the passivation layer 150 may be removed from the surface of the openings 15 facing the carrier substrate 110. As a result, the galvanic seed layer 121 on the substantially horizontal boundary surface of the openings 15 facing the carrier substrate 110 is free of passivation or connection layers.

Figure 3:
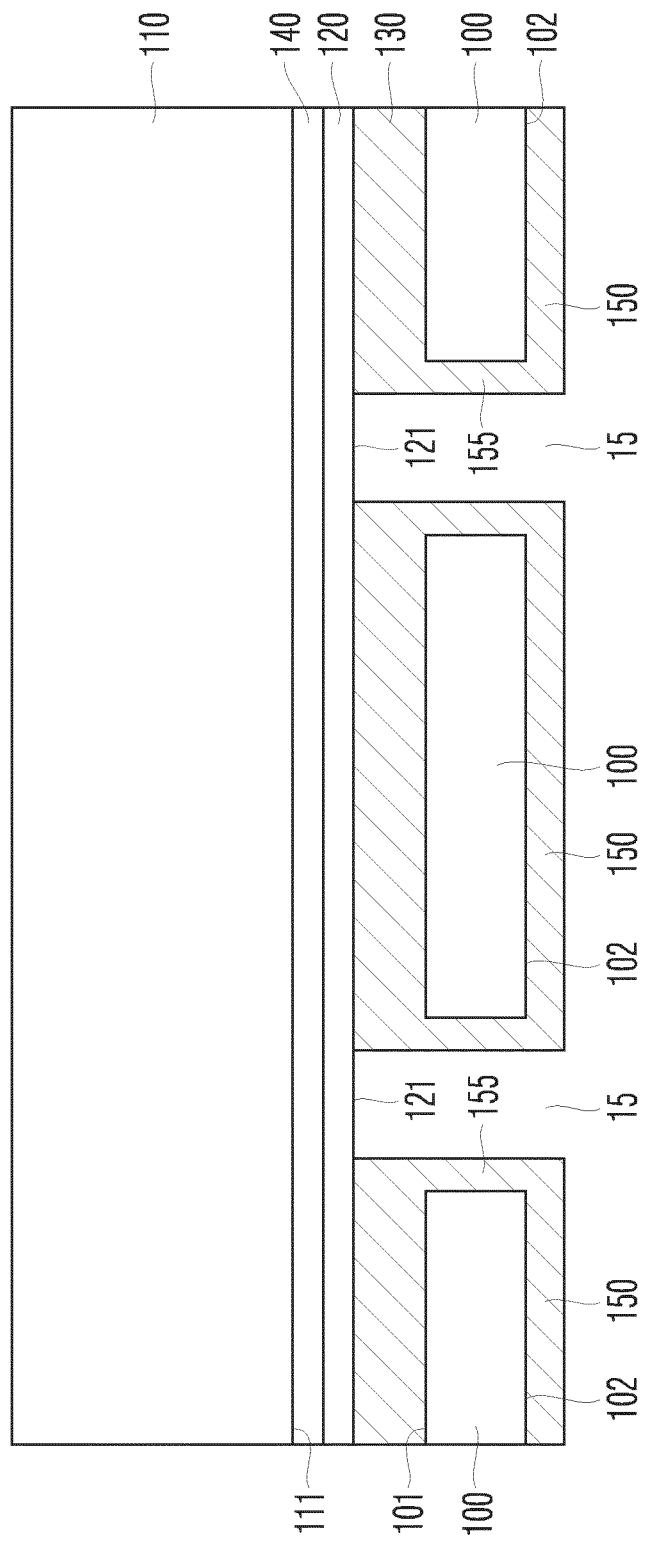

As a result, the workpiece shown in FIG. 3 may be obtained.

In the following text, a galvanic process will be carried out. For example, the workpiece may be placed in an electrolytic bath. A circuit may be established between a first pole and a second pole of a power source. The first pole of the power source may be electrically connected to a conductive material 160 located in the electrolytic bath. The second pole of the power source may be electrically connected to the galvanic seed layer 120.

As a result, the conductive material 160 may be deposited over the exposed part 121 of the galvanic seed layer 120.

The conductive material 160 may be a metal, for example, copper, nickel, or aluminum.

After completion of the galvanic process, the conductive material 160 may, for example, completely fill the openings 15 in the first substrate 100.

Figure 4:
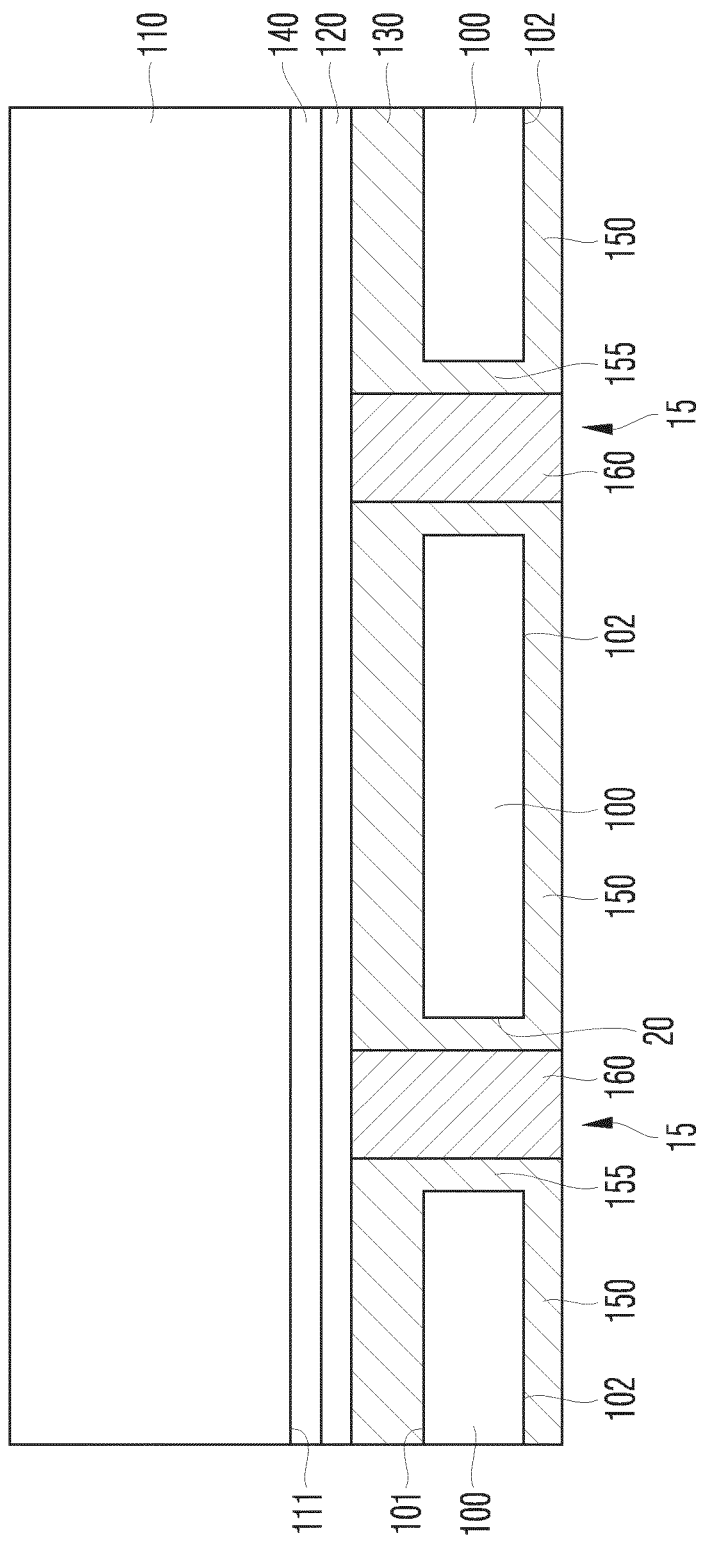

As a result, the workpiece shown in FIG. 4 may be obtained.

As the sidewalls 20 of the openings 15 are free of the galvanic seed layer 120, and only the surface of the openings 15 facing the carrier substrate 110 contains the galvanic seed layer 121, the openings 15 are evenly filled from their surface facing the carrier substrate 110 in the galvanic process.

As a result, simplification of the galvanic process is achieved. Furthermore, it is prevented that the openings 15 on their side facing away from the carrier substrate 110, via which the conductive material 160 penetrates into the openings, are closed with the conductive material 160 before they have been completely filled with the conductive material 160. Accordingly, the openings 15 may be uniformly filled without adding additional chemicals such as suppressors and/or accelerators and without voids. As a result, conductive materials such as nickel or aluminum may be deposited. In particular, conductive materials may be deposited for which such suppressors or accelerators are not known or not available.

Figure 5:
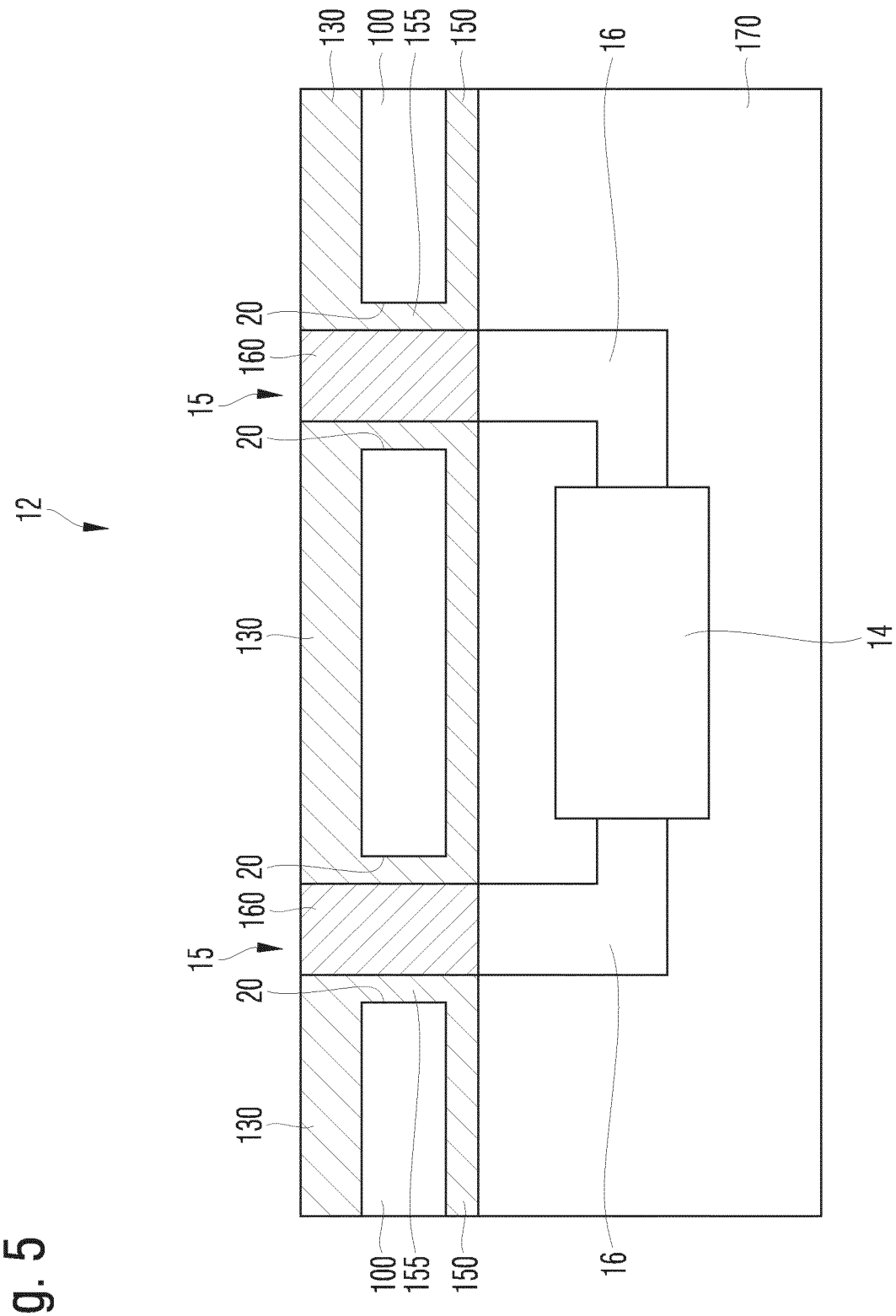
FIG. 5 shows a vertical cross-sectional view of a semiconductor device.

According to embodiments, a functional portion 14 may subsequently be electrically connected to the conductive material 160, as illustrated in FIG. 5. For example, the second main surface 102 of the first substrate 100 may be connected to a second semiconductor substrate 170. One or more functional portions 14 may be arranged within the second semiconductor substrate 170. The functional portion 14 may be electrically connected to the conductive material 160 via one or more connection elements 16.

The functional portion 14 may, for example, be an optoelectronic component. For example, the functional portion 14 may contain a first semiconductor layer of a first conductivity type, a second semiconductor layer of a second conductivity type, and an active region which is arranged between the first and second semiconductor layers.

According to further embodiments, the functional portion 14 may also be designed in a different manner. For example, a plurality of functional portions 14 may be arranged within the second semiconductor substrate 170, each of which is connected to the conductive material 160 in an associated opening 15.

According to embodiments, the carrier substrate 110 is removed in a subsequent process step.

For example, the carrier substrate 110 may be removed by means of a laser lift-off process. In this process, the carrier substrate 110 may be exposed to laser radiation. For example, the laser radiation may be pulsed. A boundary layer between the carrier substrate 110 and the separating layer 140 may heat up in the process. As a result, the carrier substrate 110 may be detached from the separating layer 140.

In a further process step, the separating layer 140 may be removed. This may, for example, be done by chemical mechanical polishing.

Furthermore, the galvanic seed layer 120 may, for example, be removed by etching.

As a result, the semiconductor device shown in FIG. 5 may be obtained.

Functional portions 14, for example, optoelectronic semiconductor portions, are arranged within the first semiconductor substrate 170. The optoelectronic semiconductor portions are, for example, electrically connected to electrically conductive material 160 via connection elements 16. The electrically conductive material 160 is arranged within openings 15 in a first substrate. The openings 15 extend from a first main surface 101 to a second main surface 102 of the first substrate 100. The sidewalls 20 of the openings 15 are covered with a passivation layer 150. The electrically conductive material may, for example, be nickel or aluminum. According to further embodiments, the electrically conductive material may also be copper.

FIG. 6 summarizes a method of manufacturing a connection structure according to embodiments.

For example, the method includes forming (S100) an opening in a first main surface of a first substrate, forming (S200) a galvanic seed layer over a first main surface of a carrier substrate, and connecting (S300) the first main surface of the first substrate to the first main surface of the carrier substrate, so that the galvanic seed layer is arranged between the first main surface of the first substrate and the first main surface of the carrier substrate. The method further includes galvanically forming (S400) a conductive material over the galvanic seed layer.

Although specific embodiments have been illustrated and described herein, persons skilled in the art will recognize that the specific embodiments shown and described may be replaced by a multitude of alternative and/or equivalent embodiments without departing from the scope of the invention. The application is intended to cover any adaptations or variations of the specific embodiments discussed herein. Therefore, the invention is to be limited only by the claims and their equivalents.

LIST OF REFERENCES 12 semiconductor device
14 functional portion
15 opening
16 connection elements 20 sidewalls of the opening
100 first substrate
101 first main surface of the first substrate
102 second main surface of the first substrate
110 carrier substrate
111 first main surface of the carrier substrate
115 second substrate
120 galvanic seed layer
121 exposed part of the galvanic seed layer
130a first connection layer
130b second connection layer
130 merged connection layer
140 separating layer
150 passivation layer
155 insulation layer
160 conductive material
170 second semiconductor substrate

The invention claimed is:

1. A method of manufacturing a connection structure, wherein the method comprises:
    forming an opening in a first main surface of a first substrate;
    forming a galvanic seed layer over a first main surface of a carrier substrate;
    forming a first insulating connection layer over the first main surface of the first substrate and over sidewalls of the opening;
    applying a second connection layer over the galvanic seed layer,
    connecting the first substrate to the carrier substrate, such that the galvanic seed layer is arranged between the first main surface of the first substrate and the first main surface of the carrier substrate and the first main surface of the first substrate is arranged between a second main surface of the first substrate and the carrier substrate;
    wherein the galvanic seed layer is formed over the first main surface of the carrier substrate before the first substrate is connected to the carrier substrate;
    thinning the first substrate such that the opening in the first substrate is opened on the second main surface of the first substrate facing away from the carrier substrate;
    removing the second connection layer from the surface of the opening facing the carrier substrate after the first substrate and the carrier substrate have been joined together such that part of the galvanic seed layer is exposed,
    galvanically forming a conductive material over the galvanic seed layer; and
    removing the carrier substrate after the second main surface of the first substrate has been connected to the second semiconductor substrate, wherein after removing the carrier substrate portions of the second connection layer are arranged over portions of the first substrate adjacent to the conductive material.

2. The method according to claim 1, further comprising forming an insulation layer over sidewalls of the opening in the first substrate.

3. The method according to claim 1, wherein the conductive material completely fills the opening in the first substrate.

4. The method according to claim 1, wherein the opening in the first substrate has a width greater than 20 μm.

5. The method according to claim 1, wherein a depth of the opening in the first substrate is greater than 50 μm.

6. The method according to claim 1, further comprising forming a separating layer over the carrier substrate, wherein the separating layer is arranged between the galvanic seed layer and the first main surface of the carrier substrate.

7. The method according to claim 1, further comprising connecting the second main surface of the first substrate to a second semiconductor substrate within which a functional portion is arranged such that the functional portion is electrically connected to the conductive material.

8. A semiconductor device obtained by the method according to claim 1.

9. The method according to claim 1, wherein a material of the first insulating connection layer is identical with the material of the second connection layer.

10. The method according to claim 6, wherein removing the carrier substrate comprises detaching the carrier substrate from the separating layer.

* * * * *